(12) United States Patent
O'Brien

(10) Patent No.: US 7,682,759 B2
(45) Date of Patent: Mar. 23, 2010

(54) METHODS AND SYSTEM FOR DETERMINING PITCH OF LITHOGRAPHIC FEATURES

(75) Inventor: Sean C. O'Brien, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 452 days.

(21) Appl. No.: 11/554,725

(22) Filed: Oct. 31, 2006

(65) Prior Publication Data

US 2008/0168416 A1 Jul. 10, 2008

(51) Int. Cl.
*G03F 1/00* (2006.01)
(52) U.S. Cl. ......................................................... 430/5
(58) Field of Classification Search ...................... 430/5, 430/22, 30, 394
See application file for complete search history.

(56) References Cited

U.S. PATENT DOCUMENTS

| 7,496,882 B2 * | 2/2009 | Hansen | 716/21 |
| 2003/0134205 A1 * | 7/2003 | Yu | 430/5 |

* cited by examiner

*Primary Examiner*—Stephen Rosasco
(74) *Attorney, Agent, or Firm*—Warren L. Franz; Wade J. Brady, III; Frederick J. Telecky, Jr.

(57) ABSTRACT

A method is provided for determining pitch of lithographic features of a mask. The method includes determining a bias based on an interaction between a plurality of reference features positioned according to a lithographic parameter of the mask, applying the bias to a plurality of lithographic features of the mask, and determining pitch of the plurality of lithographic features based on interactions between the biased plurality of lithographic features of the mask.

17 Claims, 4 Drawing Sheets

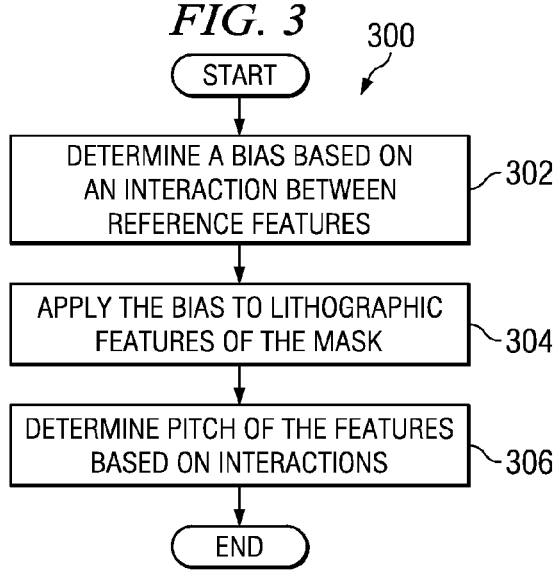
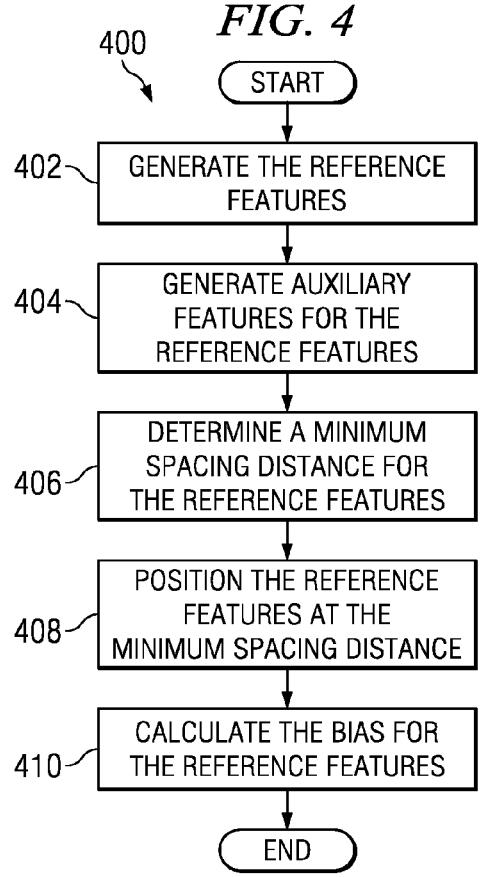
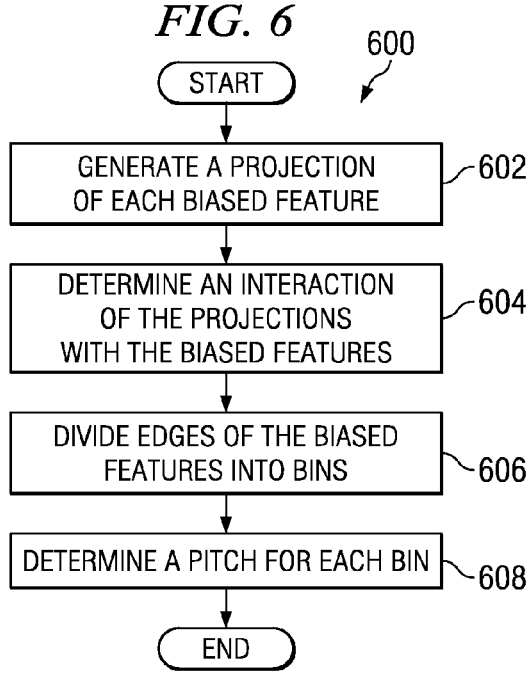
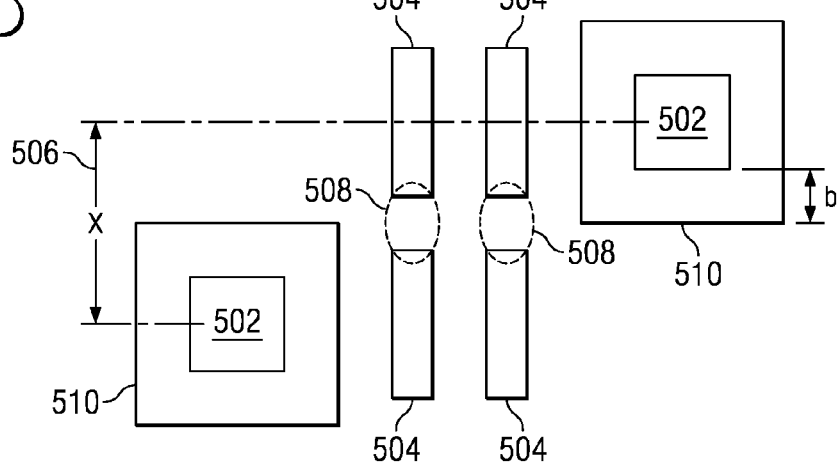

| PITCH REGION | NUMBER OF SRAF BETWEEN TWO ADJACENT MF | AF WIDTH (NM) | AF1-MF C-C SPACE SP1 (NM) | AF1-AF2 E-E SPACE SP2 (NM) |
|---|---|---|---|---|
| P<350 | 0 | N/A | N/A | N/A |
| 350<P≤550 | 1(0.5 AF/SIDE) | 64 | P/2 | N/A |
| 550<P≤680 | 2(1 AF/SIDE) | 64 | 197 | N/A |
| 680<P≤760 | 2(1 AF/SIDE) | 64 | 257 | N/A |
| 760<P≤820 | 3(1.5 AF/SIDE) | 64 | 237 | P/2 |
| 820<P≤960 | 3(1.5 AF/SIDE) | 64 | 267 | P/2 |
| 960<P≤1020 | 4(2 AF/SIDE) | 64 | 237 | 110 |
| P>1020 | 4(2 AF/SIDE) | 64 | 257 | 110 |

METHODS AND SYSTEM FOR DETERMINING PITCH OF LITHOGRAPHIC FEATURES

FIELD

The invention relates generally to systems and methods for semiconductor device manufacture.

BACKGROUND

In the semiconductor industry, intricate designs or patterns of electronic chips are generally made using lithographic techniques, such as photolithography, X-ray lithography, or extreme ultraviolet (EUV) lithography. These techniques utilize a patterned photomask or reticle in combination with certain systems to transfer patterns onto objects such as semiconductor wafers and electronic chips. For example, in a photolithographic process, a patterned photomask is used in combination with laser exposure systems to transfer patterns. Processing situations, however, may distort the resulting pattern defined on a semiconductor wafer. For example, optical diffraction may cause the pattern defined on the wafer to differ from the pattern of the photomask.

A photomask may include assist or auxiliary features that compensate for distortions in a resulting pattern transferred onto a wafer. The auxiliary features aid in the transfer of primary features of the photomask. In one technique for compensating distortions, a photomask may include sub-resolution assist features (SRAFs). An SRAF is designed to improve the process margin of a resulting wafer pattern, but not to be printed on the wafer. Typically, the SRAF is small enough and properly located on the mask so that that the SRAF is not transferred onto the wafer because the wafer features are below the dimensional resolution of the lithography system. The SRAF, however, is large enough to affect the passage of light and impacts a nearby lithographic feature.

In certain situations, however, the SRAFs may be unsatisfactory. For example, the SRAFs may print on a wafer or may violate mask rules. The unsatisfactory SRAF may be caused by interactions between SRAFs of neighboring printed photomask features or neighboring SRAFs. Accordingly, the position of the SRAFs must be accurately determined in order to prevent unsatisfactory effects in the photomask. Typically, the SRAFs positions are determining by simulating the entire mask layout including all primary and secondary features and looking for any interactions.

FIGS. 1A and 1B are diagrams illustrating a conventional method for determining the interaction of mask features for positioning SRAFs. As illustrated in FIG. 1A, a mask design 100 includes several wafer features, such as contact holes 102. Contact holes 102 are positioned in the design according to the requirements of the design.

FIG. 1B illustrates a conventional method for determining the interaction of contact holes 102 in mask layout 100. As illustrated in FIG. 1B, projections 104 are simulated for each contact hole 102. If projections 104 overlap, the overlapping edge is considered to interact with the corresponding overlapping edge. As such, the SRAFs' position and number must be determined considering the interaction. The SRAFs' position and number is determined by the pitch between the interacting contact holes. If projections 104 do not overlap, the non-overlapping edges are considered to be isolated (ISO) edges 106. As such, the conventional method will not consider the interaction between ISO edges 108 even though these contact holes are in close proximity.

According to the conventional method, the entire design must be simulated first to determine if the lithographic features and SRAFs will interact. Further, the conventional method does not recognize all possible interactions between lithographic features. In FIG. 1B, according to the conventional method, edges 108 of contact 102 do not interact. Due to their proximity, however, contacts 102 with edges 108 are not independent, but are strongly coupled. As such, if the conventional method was utilized, the SRAFs of these contacts 102 would interact and may print on the wafer. Alternatively, if the conventional method was utilized, the process margin of the main feature may be insufficient to meet the requirements of the process

SUMMARY

An embodiment is directed to a method of determining pitch of lithographic features of a mask. The method comprises determining a bias based on an interaction between a plurality of reference features positioned according to a lithographic parameter of the mask, applying the bias to a plurality of lithographic features of the mask, and determining pitch of the plurality of lithographic features based on interactions between the biased plurality of lithographic features of the mask.

Another embodiment is directed to a method of preventing photolithographic mask problem sites. The method comprises generating a plurality of reference auxiliary features for a plurality of random contacts, determining a minimum separation distance between the plurality of random contacts based on lithographic parameters, and determining a bias of the plurality of random contacts, separated by the minimum separation distance, by enlarging the area of the plurality of random contacts until the plurality of random contacts have a projection, applying the bias to a plurality of contacts of a mask, determining an interaction of the biased plurality of contacts by determining portions of an edge of one of the plurality of biased contact that interacts with projections of adjacent biased plurality of contacts, and determining pitch of the plurality of biased contacts based on interaction of edges of the plurality of biased contacts.

Another embodiment is directed to a system for determining pitch of lithographic features of a mask. The system comprising a processor and an application configured for execution by the processor comprising program instructions for determining a bias based on an interaction between a plurality of reference features positioned according to a lithographic parameter of the mask, applying the bias to a plurality of lithographic features of the mask, and determining pitch of the plurality of lithographic features based on interactions of the biased lithographic features of the mask.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the disclosure and together with the description, serve to explain the principles of the embodiments.

FIG. 3 is a flow diagram illustrating a method for determining pitch of lithographic features consistent with embodiments of the present disclosure.

FIG. 4 is a flow diagram illustrating a method for determining bias of reference features consistent with embodiments of the present disclosure.

FIG. 5 is a block diagram illustrating a method for determining bias of reference features consistent with embodiments of the present disclosure.

FIG. 6 is a flow diagram illustrating a method for determining pitch of biased lithographic features consistent with embodiments of the present disclosure.

DETAILED DESCRIPTION

Figure 1A:
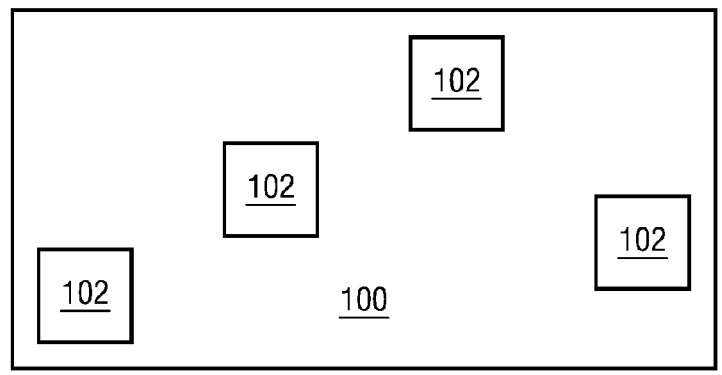
FIGS. 1A and 1B are diagrams illustrating a conventional method for positioning SRAFs.
Figure 1B:
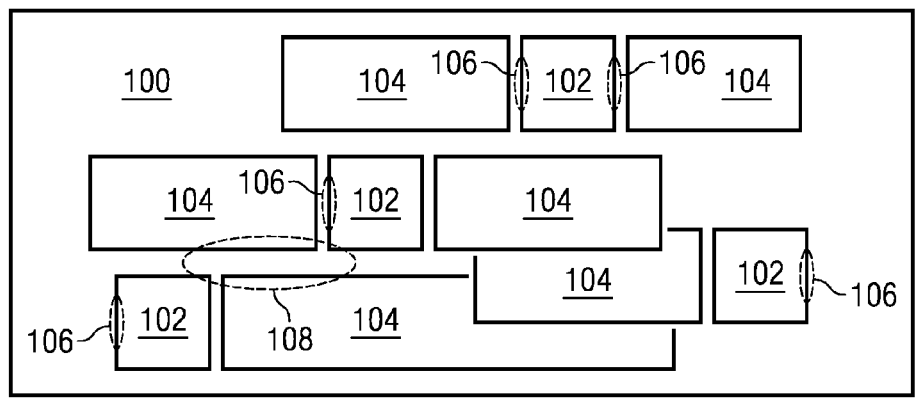

According to conventional methods, an entire mask layout for a semiconductor wafer design must be simulated first in order to determine if lithographic features and auxiliary features will interact and possibly produce unwanted printing. Further, the conventional method does not recognize all possible interactions between lithographic and auxiliary features.

According to embodiments of the present disclosure, an application, such as a semiconductor device design application, determines pitch by determining a bias that is based on an interaction between reference features. The references features may be exemplary lithographic features of a mask layout, such as a contact hole. The references features may be features which ultimately appear in the mask layout. Likewise, the reference features may be simulated features used only for determining bias and may not be actual features which appear in the mask layout.

Once the bias is determined, the bias may be applied to the lithographic features of a mask layout. Once the features are biased, the application determines the pitch based on the interaction of the biased features. Instead of determining the pitch for the entire edge of the biased lithographic feature, the application determines the pitch for portions of an edge of the biased lithographic feature. As such, a single lithographic feature may have multiple pitch values for a single edge of the feature. By having the multiple pitch values, a single lithographic feature may have multiple configurations for auxiliary features, such as SRAFs.

According to embodiments, by utilizing reference features, the application is not required to simulate the entire mask layout in order to determine feature interaction. Further, by biasing the lithographic features and dividing the edges, the application may determine interactions not typically determined by the conventional method.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 2:
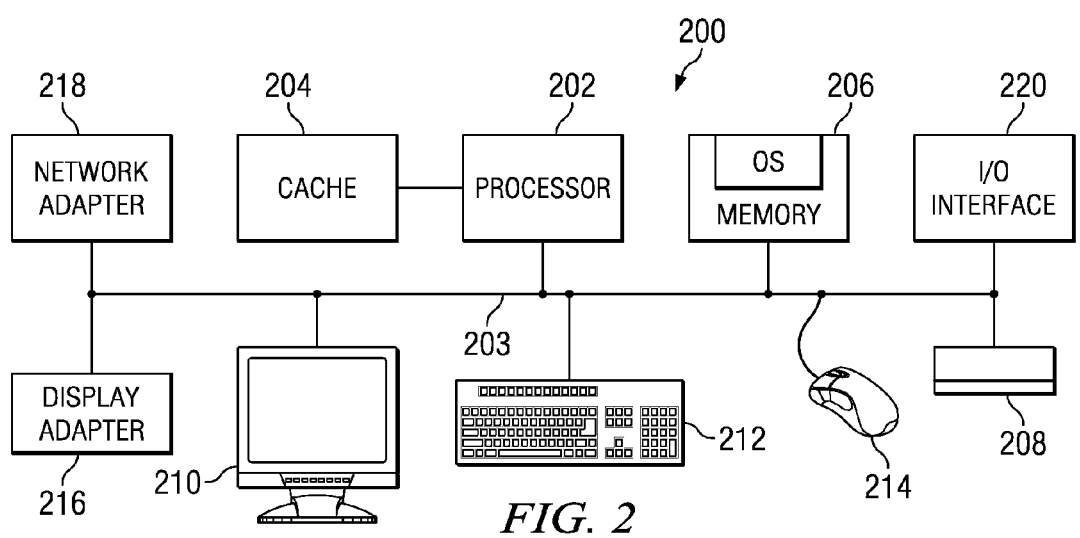
FIG. 2 is a block diagram illustrating a computing platform for determining the pitch of lithographic features consistent with embodiments of the present disclosure.

FIG. 2 is a block diagram of an exemplary computing platform 200 capable of performing embodiments of the present disclosure. Computing platform 200 may be utilized to perform the methods of the present disclosure. For, example, methods for determining pitch of lithographic features may be implemented in an application, such as a photomask design application, written in program code and executed by the computing platform 200. The application may be implemented in computer languages such as PASCAL, C, C++, JAVA, HTML and the like. One skilled in the art will realize that the methods described above may be implemented in any computer language and any application capable of designing semiconductor devices.

As shown in FIG. 2, computing platform 200 may include components such as a processor 202, a cache 204, a memory 206, a secondary memory 208, a display 210, a keyboard 212, a mouse 214, a display adaptor 216, a network adaptor 218, and input/output (I/O) interface 220. Each of these components may be coupled and communicate via a bus 203.

Processor 202 may be embodied in one or more processors. Processor 202 provides an execution platform for applications performing methods of the present disclosure. Commands and data from the processor 202 may be communicated over communication bus 203 to and from main memory 206. Main memory 206 may be, for example, a Random Access Memory (RAM). Main memory 206 may store the operating system and applications implementing the methods of the present disclosure, which may be executed during runtime.

Likewise, applications implementing the method of the present disclosure may be stored on secondary memory 208. Secondary memory 208 may include, for example, one or more of a hard disk drive and/or a removable storage drive, a floppy diskette drive, a magnetic tape drive, a compact disk drive, and the like. Computer platform 200 may read from and/or write to secondary memory 208. Likewise, secondary memories 208 may read from and/or write between themselves in a well-known manner.

Users of computing platform 200 may interface with and control computing platform 200 utilizing keyboard 212 and mouse 214. Computing platform may utilize display 210 and display adapter 216 to output data, such as the mask layout, for viewing by the users. For example, display adapter 216 may receive display data from the processor 202 and convert the display data into display commands for display 210.

Network adapter 218 may allow computing platform 200 to send and receive data via a network. Additionally, I/O interface 220 may allow computing platform 220 to input data from and output data to other electronic devices. For example, I/O interface 220 may be coupled to a lithographic apparatus for receiving semiconductor design data and transmitting the results of the methods of the present disclosure.

As mentioned above, any of the methods may be performed by an application executed on computing platform 200. The application may be embodied on a computer readable storage medium as instruction for causing computer platform 200 to perform the instructions. The computer readable storage medium may include storage devices and signals, in compressed or uncompressed form Exemplary computer readable signals, whether modulated using a carrier or not, are signals that a computer system hosting or running the present invention can be configured to access, including signals downloaded through the Internet or other networks. Concrete examples of the foregoing include distribution of executable software programs of the computer program on a CD-ROM or via Internet download. In a sense, the Internet itself, as an abstract entity, is a computer readable medium. The same is true of computer networks in general.

According to embodiments of the present disclosure, an application, such as a photomask design application, may determine pitch of lithographic features. FIG. 3 is a flow diagram illustrating an exemplary method 300 for determining pitch of lithographic features in a semiconductor device consistent with embodiments of the present disclosure. Method 300 may be implemented in any type of application for designing, editing, and creating lithographic masks executed on a computing platform. For example, method 300 may be performed on any computing platform or computing platform in a network system, such as computer platform 200 described above. One skilled in the art will realize that method 300 may be performed on any computing platform in which semiconductor devices are designed.

An application, which implements method 300, determines pitch by determining a bias that is based on an interaction between reference features. Once the bias is determined, the bias may be applied to the lithographic features of a mask layout. Once the features are biased, the application determines the pitch based on the interaction of the biased features.

Method 300 begins with the application determining a bias for reference features (stage 302). The reference features may be exemplary lithographic features of a semiconductor device, such as a contact hole. The reference features may be features which ultimately appear in the mask layout. Likewise, the reference features may be simulated features used only for determining bias and may not be actual features which appear in the mask layout.

The bias represents an amount the reference features may be enlarged to cause an interaction between the reference features. The application may determine the bias by determining the interaction between the reference features after an enlargement. To determine the enlargement amount, the application may first position the reference features based on a lithographic parameter. For example, the lithographic parameter may be reticle parameters or lithographic apparatus parameters such as exposure wavelength, numerical aperture of the lens, and/or geometry of the entrance pupil.

For example, the reference features may include auxiliary features. The application may position the reference features and auxiliary features relative to one another such that any closer positioning may violate a rule of mask design.

After the bias is determined, the application applies the bias to the lithographic features of the mask layout (stage 304). In order to apply the bias, the application creates the mask layout. Then, the application applies the bias by enlarging the lithographic features of the mask layout by the bias.

Then, the application determines pitch of the biased lithographic features (stage 306). The application determines the pitch by determining the interaction of the biased lithographic features. For example, the application may determine interaction by utilizing a projection method.

Instead of determining the pitch for the entire edge of the biased lithographic feature, the application determines the pitch for portions of an edge of the biased lithographic feature. As such, a single lithographic feature may have multiple pitch values for a single edge. By having the multiple pitch values, a single lithographic feature may have multiple auxiliary feature configurations.

For example, if only half of one edge of a first biased lithographic feature interacts with another lithographic feature, only the interacting half may be considered to interact with the other lithographic feature. The other half of the edge may be considered isolated. As such, the application may determine a pitch value for the isolated half and a separate pitch value for the interacting half. By dividing the edge, the lithographic feature will have two different auxiliary feature configurations.

As mentioned above, in method 300, the application determines a bias for the lithographic. FIGS. 4 and 5 are a flow diagram and block diagram, respectively, illustrating an exemplary method 400 for determining a bias of the reference features. Method 400 may be performed at stage 302 of method 300 in order to determine the bias.

Method 400 begins with the application generating reference features (stage 402). The references features represent exemplary lithographic features of a semiconductor device which may appear in the mask layout. FIG. 5 illustrates exemplary reference contact holes 502 which may be utilized during method 400.

As shown in FIG. 5, reference contact holes 502 may be placed in close proximity. Reference contact holes 502 may be created to be any shape and size which is representative of the mask layout. Contact holes 502 may be features which ultimately appear in the mask layout. Likewise, contact holes 502 may be simulated features used only for determining bias and may not be actual features which appear in the mask layout.

Returning to method 400, after generating the reference features, the application generates auxiliary features for the reference features (stage 404). The auxiliary features may be generated according to standard lithographic techniques. The auxiliary features may be generated by assuming that the reference features are isolated. That is, the auxiliary features may be generated without considering interaction with other lithographic features.

For example, the application may generate SRAFs 504 for reference contact holes 502 as illustrated in FIG. 5. SRAFs 504 may be generated for each contact holes 502 as if contact holes 502 were isolated.

After generating the auxiliary features, the application determines a minimum spacing distance for the reference features (stage 406). The application may determine the minimum spacing distance by decreasing the distance between the reference features until the reference features violate a lithographic parameter, such as a rule of the mask design.

For example, as illustrated in FIG. 5, the application may decrease the distance between contact holes 502 until a spacing 508 between SRAFs 504 violate a mask rule. Spacing 508 may be the minimum distance at which a lithographic device may resolve the features or spacing 508 may exceed the manufacturing capability of the reticle manufacture. The distance between contact holes 502 at which the rule is violated may be the minimum spacing distance 506.

Next, the application positions the reference features at the minimum spacing distance (stage 408). For example, as illustrated in FIG. 5, the application may position contact holes 502 at minimum spacing distance 506.

Then, the application calculates the bias for the reference features (stage 220). The application may determine the bias by enlarging the reference features until the reference features are no longer considered isolated. For example, the application may enlarge the reference feature until a projection of the features overlap. The bias would be the difference between the original size of the reference feature and the enlarged size.

For example, as illustrated in FIG. 5, contact holes 502 may be enlarged until contact holes 502 have projections that overlap. The difference between the original size of contact holes 502 and the enlarged contact holes 502 would be bias 510.

Figure 7A:
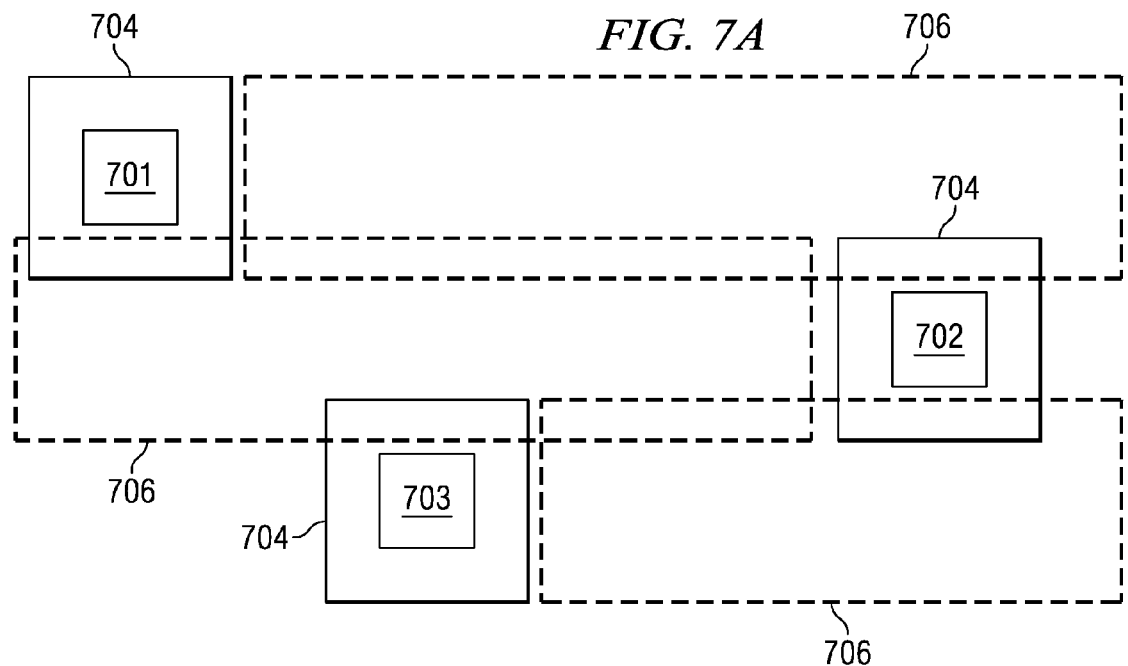
FIGS. 7A and 7B are block diagrams illustrating a method for determining pitch of biased lithographic features consistent with embodiment of the present disclosure.
Figure 7B:
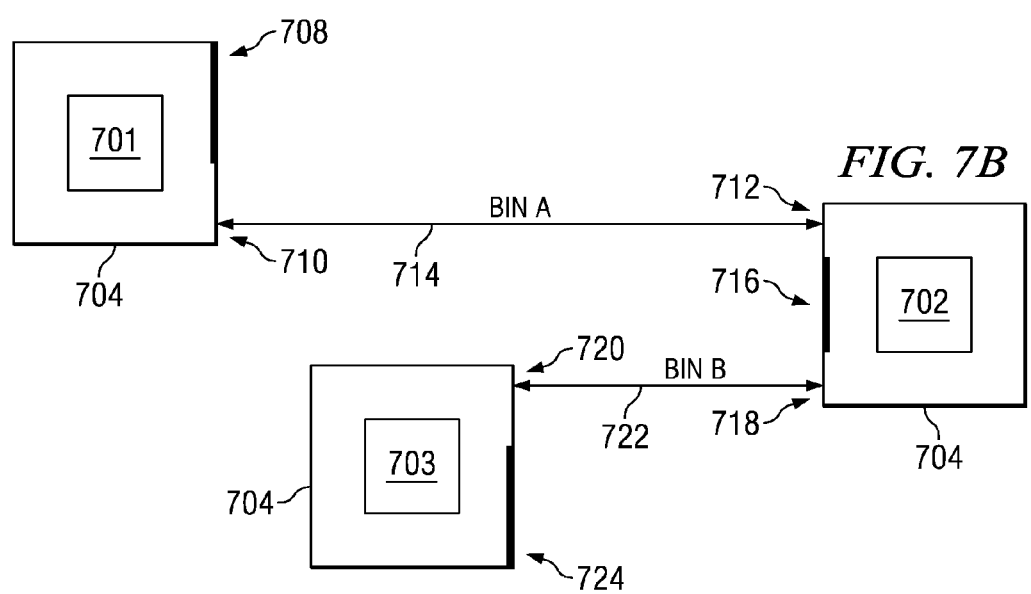

As mentioned above, during method 300, the application determines pitch of the biased lithographic features. FIGS. 6 and 7A-B are a flow diagram and a block diagrams, respectively, illustrating an exemplary method 600 for determining the pitch of lithographic features. Method 600 may be utilized at stage 306 of method 300.

Prior to beginning method 600, the application may have previously generated the mask layout and biased the lithographic features with a determined bias. Method 600 begins with the application generating a projection of each biased feature (stage 602). A projection may be an extension projected out from one edge of a lithographic feature. The projection may be the width of the projected edge.

FIG. 7A illustrates an exemplary mask layout with three contact holes 701, 702, and 703 that are biased to an amount 704. One skilled in the art will realize that the mask layout in FIG. 7A is exemplary and that the mask layout may include any type and number of lithographic features.

As illustrated in FIG. 7A, the application generates a projection 706 from one edge of each contact hole 701, 702, and 703. The projection consists of a simulated rectangle that has a width equal to the edge from which the rectangle is projected.

Next, the application determines an interaction of the projection and the biased features (stage 604). The application may determine the interaction by utilizing any method to determine if the lithographic features will interact during printing. For example, as illustrated in FIG. 7A, the application may determine an interaction for biased contact holes 701, 702, and 703 if projections 706 overlap any other biased contact hole.

Next, the application divides edges of the biased features into bins (stage 606). The application divides the edges based on the interaction between the biased lithographic features. For example, as illustrated in FIG. 7B, the application divides the edges into portions that may have an interaction and portions with no interaction. In other words, the application divides the edges based on the overlap of projection 706.

In this example, the edge of contact hole 701 may be divided into two portions 708 and 710. Portion 708 may have no interaction and may be considered isolated. Based on projection overlap, portion 710 may interact with portion 712 of contact hole 702. As such, portion 710 of the edge of contact hole 701 and portion 712 of the edge of contact hole 702 may be classified as Bin a 714.

The edge of contact hole 702 may be divided into three portions. Contact hole 702 may include portion 712 which interacts with portion 710 of contact hole 701. Contact hole 702 may include an isolated portion 716. Further, based on the projection overlap, contact hole 702 may include a portion 718 which interacts with portion 720 of contact hole 703. As such, portion 718 of the edge of contact hole 702 and portion 720 of the edge of contact hole 703 may be classified as Bin b 722. The edge of contact hole 703 may also have a portion 724 with no interaction and may be considered isolated.

Then, the application determines a pitch for each bin (stage 608). The application may determine pitch for each bin in which interaction was determined. Likewise, the application may determine pitch for portions with no interaction. The application may determine the pitch by measuring the distance between portions of the edges of the lithographic features included in the bin.

As illustrated in FIG. 7B, the application may determine the pitch for Bin a 714 by measuring the distance between portion 710 and 712. Likewise, the application may determine the pitch for Bin b 722 by measuring the distance between portion 718 and 720. The application may determine the pitch for isolated portions 708, 716, and 724 by considering these portions to be isolated.

Once the application determines the pitch for all the lithographic features, the application may generate auxiliary features for the lithographic features. The auxiliary features may be generated according to any known method for generating auxiliary features. Once these auxiliary features are generated, the auxiliary features may be used without modification, or the auxiliary features may be subsequently modified prior to generation of the mask or reticle.

Figures 8, 9:
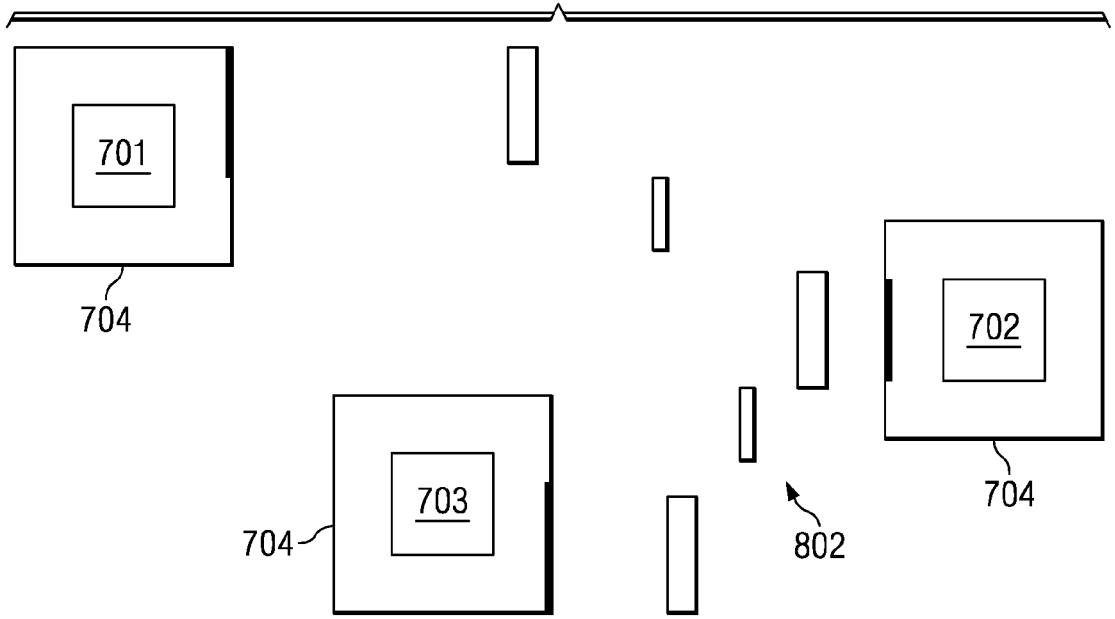
FIG. 8 is a block diagram illustrating a method for generating auxiliary features consistent with embodiments of the present disclosure.
FIG. 9 is a table illustrating SRAF position and size corresponding to various pitch values.

FIG. 8 is a diagram illustrating exemplary SRAFs 802 for the mask layout described in FIGS. 7A and 7B. As illustrated in FIG. 8, contact holes 701, 702, and 703 may include different SRAF configuration for a single edge. This is due to the multiple pitch values determined for an edge of a contact hole. For example, the application may generate three separate SRAFs for contact hole 702. That is, the application generates an SRAF for bin a 714, an SRAF for isolated portion 716, and an SRAF for bin b 722. The application may determine the position and size of the SRAFs by utilizing a pitch table illustrated in FIG. 9.

Other embodiments of the present teaching will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of determining pitch of lithographic features of a mask, comprising:
   determining a bias based on interactions caused by enlargement between a plurality of reference lithographic features representative of all actual mask design lithographic features positioned according to a lithographic printing parameter of the mask;
   applying the determined bias to a plurality of actual lithographic features of the mask design, the number of the plurality of actual lithographic features being greater than the number of reference lithographic features; and
   determining pitch of the plurality of actual lithographic features based on interactions between the biased plurality of actual lithographic features.

2. The method of claim 1, wherein determining the bias comprises:
generating the plurality of reference lithographic features;
generating a plurality of auxiliary features for the plurality of reference lithographic features;
determining a minimum spacing distance for the plurality of reference lithographic features based on the lithographic printing parameter;
positioning the plurality of reference lithographic features at the minimum spacing distance; and
calculating the determined bias for the plurality of reference lithographic features based on interactions caused after enlargement.

3. The method of claim 2, wherein calculating the determined bias comprises increasing the size of the plurality of reference lithographic features until the plurality of reference lithographic features have a projection, wherein the bias is approximately equal to the increase in size.

4. The method of claim 2, wherein determining the minimum spacing distance comprises determining a minimum distance at which interactions of the plurality of auxiliary features do not violate the lithographic printing parameter.

5. The method of claim 4, wherein the lithographic printing parameter is a reticle mask rule.

6. The method of claim 1, wherein determining pitch of features, comprises:
generating a projection of each actual lithographic feature of the biased plurality of actual lithographic features
determining interactions of the projections;
dividing edges of the biased plurality of lithographic features into portions based on the interactions of the projections; and
determining a pitch for each edge portion.

7. A computer readable medium containing instruction for causing a processor to perform the method of claim 1.

8. A method of preventing photolithographic mask problem sites, the method comprising:
generating a plurality of reference auxiliary features for a plurality of actual or simulated reference contacts representative of a randomly selected subset of a plurality of actual contacts of a mask design;
determining a minimum separation distance between the plurality of reference contacts based on lithographic printing parameters;
determining a bias of the plurality of reference contacts, separated by the minimum separation distance, by analyzing projections established by enlarging the areas of the reference contacts of the plurality of reference contacts;
applying the determined bias to the plurality of actual contacts of the mask design;
determining interactions of the biased plurality of actual contacts by determining interactions of portions of edges of ones of the biased plurality of actual contacts with projections of adjacent others of the biased plurality of actual contacts; and
determining pitches of the biased plurality of actual contacts based on the determined interactions of edges.

9. The method of claim 8, wherein the plurality of reference auxiliary features are sub-resolution assist features (SRAFs).

10. The method of claim 9, wherein the plurality of reference auxiliary features comprise reference sub-resolution assist features.

11. The method of claim 8, wherein the lithographic printing parameters are reticle mask rules.

12. The method of claim 8, wherein the determining of the minimum separation distance comprises decreasing the distance between centerlines of the plurality of reference contacts until an interaction occurs violating the lithographic printing parameters.

13. A computer readable medium containing instruction for causing a processor to perform the method of claim 8.

14. A method of manufacturing a semiconductor device from a photomask designed using processor-executed instructions, comprising:
generating a plurality of reference lithographic features corresponding to an actual or simulated less than all of actual lithographic features of a mask layout;
generating a plurality of reference sub-resolution assist features for the plurality of reference lithographic features;
determining a bias based on establishing mask positions for the generated reference lithographic and sub-resolution assist features according to one or more reticle or lithographic machine operating parameters, and determining an enlargement amount for which the generated reference lithographic and sub-resolution assist features in the established positions will cause interactions;
applying the determined bias to all of the actual lithographic features of the mask layout; and
determining pitch based on interactions of the biased all of the actual lithographic features.

15. The method of claim 14, wherein pitch is determined for separate portions of edges of the biased all of the actual lithographic features where separate portions of the edges have different interactions.

16. The method of claim 14, wherein the one or more operating parameters comprise one or more of exposure wavelength, lens numerical aperture, and entrance pupil geometry.

17. The method of claim 14, further comprising determining actual sub-resolution assist features of the mask layout based on the pitches determined for the actual lithographic features.

* * * * *